United States Patent [19]
Omoto

[11] Patent Number: 5,523,720
[45] Date of Patent: Jun. 4, 1996

[54] FM SIGNAL DEMODULATOR PHASE LOCKED LOOP

[75] Inventor: Noriaki Omoto, Takatsuki, Japan

[73] Assignee: Matsushita Electric Industrial Co., Ltd., Osaka, Japan

[21] Appl. No.: 361,636

[22] Filed: Dec. 22, 1994

[30] Foreign Application Priority Data

Dec. 22, 1993 [JP] Japan .................................. 5-324919
Dec. 27, 1993 [JP] Japan .................................. 5-333382

[51] Int. Cl.$^6$ .............................. H03D 3/00; H03L 7/08
[52] U.S. Cl. .............................. 329/325; 329/318; 331/23; 455/208; 455/214; 455/337
[58] Field of Search .................................. 331/8, 10, 15, 331/17, 20, 23, 25; 329/325, 326, 318–321; 348/536, 726, 727, 733, 735; 455/208, 209, 337, 214

[56] References Cited

U.S. PATENT DOCUMENTS

| | | | |
|---|---|---|---|
| 4,107,624 | 8/1978 | Turner | 331/8 |
| 4,568,888 | 2/1986 | Kimura et al. | 331/15 X |
| 4,879,528 | 11/1989 | Gotanda | 331/15 X |

FOREIGN PATENT DOCUMENTS 0074687 3/1983 European Pat. Off. .
0351153 1/1990 European Pat. Off. .

OTHER PUBLICATIONS

H. Yabuki, M. Sagawa, and M. Makimoto, "New Type of Push–push Oscipliers for the Frequency Synthesizer," 1992 IEEE MTT–S International Microwave Symposium Digest, vol. 2, 1 Jun. 1992, Albuquerque, pp. 1085–1088 European Search Report, Mar. 23, 1995.

*Primary Examiner*—David Mis
*Attorney, Agent, or Firm*—Ratner & Prestia

[57] ABSTRACT

A frequency modulation signal demodulator receives an intermediate frequency signal to demodulate a FM signal. The frequency modulation signal demodulator includes a voltage-controlled oscillator having variable capacitance diodes. The voltage-controlled oscillator varies the oscillating frequency of a signal by controlling a voltage across the variable capacitance diodes using a DC voltage. Also included is a phase comparator which produces a phase difference by comparing the phase of the intermediate frequency signal to the phase of the signal from the voltage-controlled oscillator and provides a direct current voltage signal corresponding to the phase difference. Also included is a differential amplifier which has an adjustable reference voltage source. The differential amplifier amplifies the direct current voltage signal to produce a demodulated signal. The demodulated signal is negatively fed back to the voltage-controlled oscillator as the direct current signal.

22 Claims, 9 Drawing Sheets

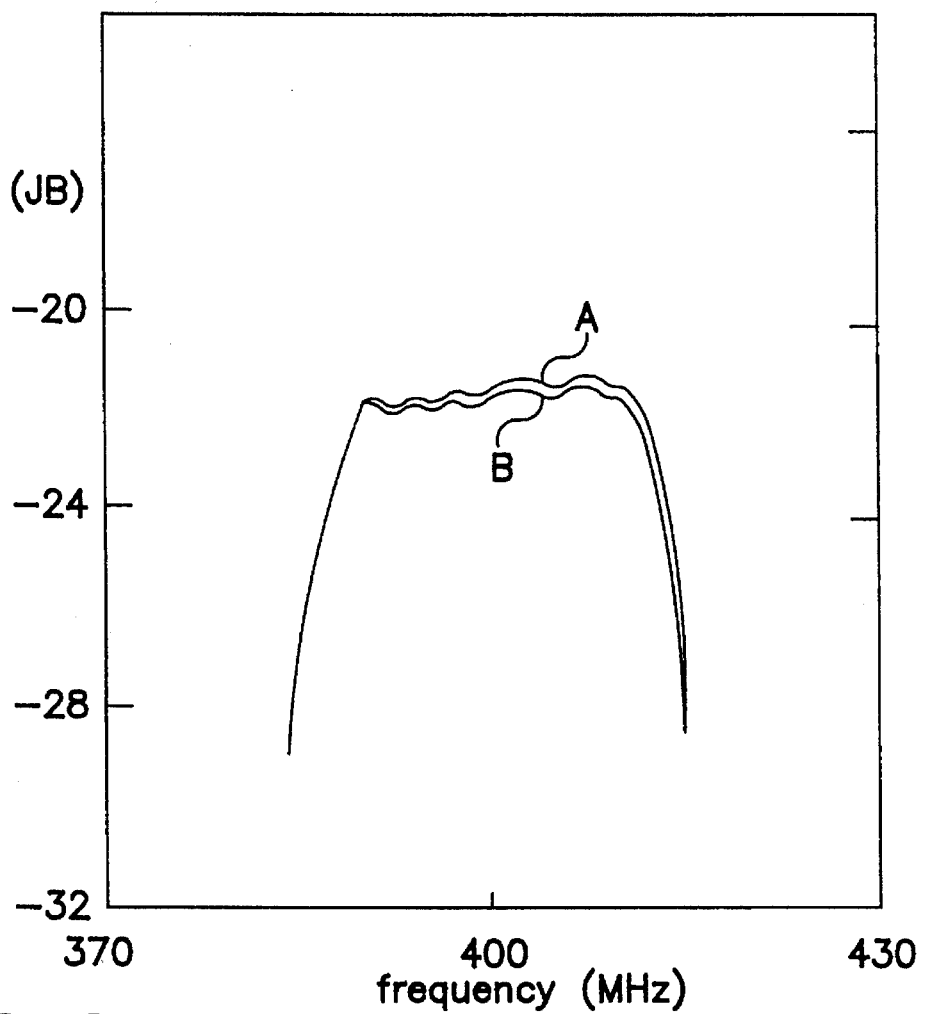
FIG. 2 Prior Art    frequency characteristic

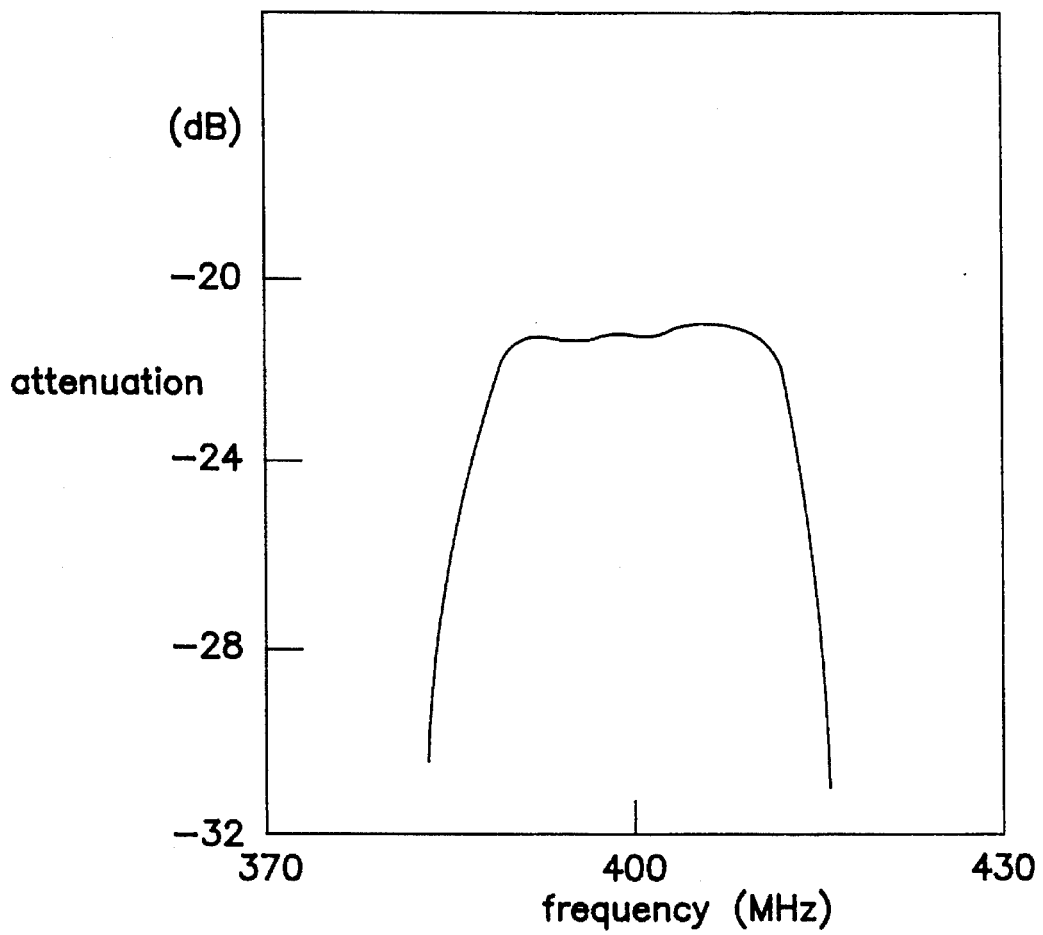
FIG. 8   frequency characteristic

FM SIGNAL DEMODULATOR PHASE LOCKED LOOP

BACKGROUND OF THE INVENTION

1. Field of the Invention

The present invention relates to an FM signal demodulator for demodulating a frequency modulated video signal widely used in satellite television broadcasts or the like. Particularly, the present invention relates to an apparatus for providing stable demodulation performance by reducing interference caused by oscillation component radiates and leaks into the input stage of the apparatus.

2. Description of the Prior Art

In a satellite television broadcast, frequency modulation (FM) is used for transmitting video signals. The FM signal is demodulated at a 400 MHz band. This is called the second intermediate frequency (IF). Recently, it has been proposed that the FM signal demodulator using a phase locked loop be formed on integrated circuits (IC) to miniaturize the apparatus and reduce power consumption.

FIG. 1(a) is a block diagram of an FM signal demodulator in accordance with the prior art. A wide band FM signal having a second IF of 400 MHz is modulated by a video signal. The wide band FM signal is provided to a second IF input terminal 1. A surface acoustic wave (SAW) bandpass filter 2, a channel filter, is used for removing signals outside the band and noise. A second IF amplifier 3 amplifies the selected signal to a desired level to demodulate the FM signal. The second IF amplifier 3 is an amplifier with a constant gain or a variable gain amplifier which is set to a desired gain by a control signal.

A phase comparator 12 (1) detects a phase difference between an inputted FM signal and an output signal of a voltage controlled oscillator 18 and (2) outputs a DC voltage corresponding to the phase difference. The output is a video signal including a DC component which is supplied to demodulator output terminals 16 and 17 through a low pass filter composed of first and second differential amplifiers 13 and 15, respectively, and is negatively fedback to the voltage controlled oscillator 18. Thus, a phase locked loop is formed.

The voltage controlled oscillator 18 is made into an IC by using the circuit shown in FIG. 1(b) according to, for example, Japanese Patent Publication Laid Open 2-21707. The DC source voltage for the voltage-controlled oscillator 18 is supplied from terminal 30. A high level signal such as the oscillation signal can cause interference with the other circuits inside the IC. Accordingly, a differential amplifier composed of transistors 33 and 34 is used and the balanced signals output from the collectors of the transistors 33 and 34 are supplied to the phase comparator 12. Capacitors 36 and 37 are connected in series from a collector of transistor 34 to a base of transistor 33 and capacitors 38 and 39 are connected in series from a collector of transistor 33 to a base of transistors 34. These connections provide positive feedback to the transistors. An anode of a variable capacitance diode 40 and a terminal of an air-core coil 46 are connected to a junction of capacitors 36 and 37. An anode of a variable capacitance diode 41 and a terminal of air-core coil 45 are connected to a junction of capacitors 38 and 39. The other terminals of the air-core coils 45 and 46 are grounded. Cathodes of the variable capacitance diodes 40 and 41 are connected to each other and to a control terminal 44 through resistor 42 and air-core coil 43 connected in series.

The voltage controlled oscillator 18 oscillates at a resonance frequency determined by a resonant circuit composed of the variable capacitance diodes 40 and 41 and the air-core coils 45 and 46. The voltage controlled oscillator 18 is a frequency modulator controlled by the video signal demodulated output. Accordingly, it is desirable that an output impedance of the second differential amplifier 15 at the control terminal 44 is as low as possible to follow variations in the video signal at the video signal frequency band of less than 10 MHz. It is desirable that the impedance at the junction between the variable capacitance diodes 40 and 41 is high enough at the 400 MHz band to normally oscillate at the high second IF of 400 MHz. A high impedance is obtained by connecting resistor 42 and air-core coil 43 in series.

Because the FM signal demodulator shown in FIG. 1(a) forms a phase locked loop, the frequency of an input FM signal coincides with the oscillation frequency of the voltage controlled oscillator 18 in a synchronization state. When the second IF is a center frequency, for example, when the output voltage of the second differential amplifier 15 becomes a center value of the demodulated output voltage, it is desirable that the second differential amplifier 15 is in an equilibrium state. Then, it is also desirable that the output voltage is at a center value of the dynamic range and that the dynamic range of the demodulation characteristic is at a maximum.

It is also desirable that the linearity of the oscillation frequency against the control voltage of the voltage controlled oscillator 18 is set at this voltage.

The oscillation frequency of the voltage controlled oscillator 18 is determined by the variable capacitance diodes 40 and 41 and the air-core coils 45 and 46. The variable capacitance diodes 40 and 41 usually have a capacitance dispersion of about ±15% when their cross terminal voltages are constant.

Due to this dispersion, the voltage controlled oscillator 18 does not always oscillate at the center frequency at the center of the output dynamic range of the second differential amplifier 15. Accordingly, in the prior art, the coil inductance is varied by widening or narrowing the winding gaps of the air-core coil 45 or 46 and thus, the oscillation frequency is adjusted by compensating the dispersion of the variable capacitance diodes so that the voltage controlled oscillator 18 oscillates at the center frequency at the center of the output dynamic range of the second differential amplifier 15.

A differential balance controller 14 adjusts the oscillation frequency of the voltage controlled oscillator 18 so that it coincides with the center frequency of the second IF frequency when the FM signal is not supplied to the phase comparator. Thus a free running frequency of a phase locked loop type FM signal demodulator is adjusted.

Recently, almost all functions concerning FM signal demodulation such as second IF amplifier 3, phase comparator 12, second differential amplifier 15, voltage controlled oscillator 18, a detector for an automatic frequency controller (AFC), and a detector for an automatic gain controller (AGC) have been integrated into an IC. Some developments are being pursued which would include more peripheral circuit elements in the IC. There is also a trend to increase the gain of the second IF amplifier 3 as high as possible and to increase input sensitivity of the IC.

The output signal of the demodulated output terminal 16 and the reference voltage 19 are supplied to a voltage comparator 20. Because the output voltage of the FM signal demodulator is proportional to the frequency of the inputted FM signal, frequency comparison can be done at voltage comparator 20. The voltage of the reference voltage source 19 is adjusted to a voltage corresponding to the frequency to be compared. Thus, the output signal at the output terminal 21 of the voltage comparator 20 can be used as a control voltage for AFC.

In the circuit configuration in accordance with the prior art, however, the modulated output voltage does not always reach the center of the dynamic range of the second differential amplifier 15 at the center frequency of the second IF signal, because of the capacitance dispersion of the variable capacitance diodes 40 and 41. Therefore, the oscillation frequency of the voltage controlled oscillator 18 is adjusted by widening or narrowing the winding gaps of the air-core coils 45 and 46. But the adjustment of the air-core coils is not easily performed as that of the variable resistors. In addition, precise adjustment of the air-core coils is very difficult.

Although the circuit configuration in accordance with the prior art can reduce interference due to a radiating signal, when the air-core coils 40 and 41 are inserted in a printed circuit board, the oscillation signal component radiates from the air-core coils 40 and 41 to the rear surface of the board or to the air. In addition, leaks into the input of the FM signal demodulator can result. As a result, interference can occur easily.

Interference can occur easily because, as noted above, the IC has a high input sensitivity. In addition, as a channel filter, SAW filter 2 has been recently used for non-adjustment and for providing a good cutoff characteristic. However, the insertion loss of the SAW filter can be approximately 25 dB. Because this insertion loss is much bigger than that of a usual LC filter (about 4 dB) and the output signal level is low, performance deterioration is promoted by radiating and leaking of the oscillation signal component.

FIG. 2 shows a frequency characteristic from the input terminal 1 to the monitor terminal 7 of the second IF signal in FIG. 1. Wave form A is the characteristic when the voltage controlled oscillator 18 stops oscillation and wave form B is the characteristic when the voltage controlled oscillator 18 normally oscillates and the phase locked loop synchronizes. The signal from the voltage-controlled oscillator 18 leaks to the input stage of the FM signal demodulator causing interference and the wave form of the SAW bandpass filter 2 to be disturbed. This is because the signal from the voltage controlled oscillator 18 synchronizes with the input FM signal leaks causing an interference signal which is superimposed on the original signal with a deviated phase and a deviated amplitude. A similar phenomenon to this phenomenon occurs in a transmission system where multiple reflections occur. As a result, the characteristics of the demodulated video signal such as differential gain, differential phase and the like are deteriorated.

SUMMARY OF THE INVENTION

The present invention relates to an FM signal demodulator which is easy to adjust and produce.

The present invention further relates to an FM signal demodulator which (1) reduces the occurrence of interference due to radiating and leaking of the oscillation signal component of a voltage-controlled oscillator to the input stage of the FM signal demodulator and (2) provides stable demodulation performance.

An FM signal demodulator in accordance with an exemplary embodiment of the present invention includes a voltage controlled oscillator which varies the oscillation frequency by controlling variable capacitance diodes which are resonant elements of a resonance circuit using a DC voltage supplied to a control terminal. Also provided is a phase comparator which produces a DC output by comparing the phase of the inputted IF signal and the phase of the signal from the voltage controlled-oscillator. Also included is a differential amplifier which has a variable reference voltage source and a demodulated signal output which is produced by amplifying the output of the phase comparator. In addition, the demodulated output of the differential amplifier is negatively fed back to the control terminal of the voltage controlled oscillator.

In an exemplary embodiment of the present invention, a center frequency of the IF signal is provided to the phase comparator and the reference voltage of the differential amplifier is adjusted while the IF signal and the signal of the voltage-controlled oscillator are synchronized in the negative feedback loop. In addition, the DC levels of the balanced outputs of the differential amplifier are adjusted and a deviation from equilibrium at the differential amplifier due to capacitance dispersion of the variable capacitance diodes is compensated.

An FM signal demodulator in accordance with a second exemplary embodiment of the present invention includes a voltage-controlled oscillator which varies the oscillation frequency by controlling the capacitances of the variable capacitance diodes which are resonant elements of a resonance circuit using a DC voltage supplied to a control terminal and a fine adjustment reference voltage. Also included is a phase comparator which provides a DC output corresponding to a phase difference produced by comparing the phase of the inputted IF signal and the phase of the voltage-controlled oscillator signal. A differential amplifier is also included to produce a demodulated signal by amplifying the output of the phase comparator. The demodulated output of the differential amplifier is negatively fed back to the control terminal of the voltage-controlled oscillator.

In a second exemplary embodiment of the present invention, the center frequency of the IF signal is inputted to the phase comparator and the oscillation frequency is varied by controlling the variable capacitance diodes which are resonant elements of a resonance circuit using a reference voltage of the voltage-controlled oscillator while the IF signal and the signal of the voltage controlled oscillator are synchronized in the negative fedback loop. In addition, the DC levels of the balanced outputs of the differential amplifier are adjusted and a deviation from equilibrium at the differential amplifier due to the capacitance dispersion of the variable capacitance diodes is compensated.

An FM signal demodulator in accordance with a third exemplary embodiment of the present invention includes a voltage-controlled oscillator which provides a differential amplifier positively fedback by a resonance circuit composed of a pair of variable capacitance diodes. Also included is a pair of micro strip lines which have substantially the same length. Also included is a differential amplifier which is positively fed back by capacitors which vary the oscillation frequency by controlling the variable capacitance diodes which are resonant elements of a resonance circuit using a DC voltage supplied to a control terminal. A phase comparator is also provided for producing a DC output corresponding to a phase difference which corresponds to the phase of the inputted IF signal compared to the phase of the voltage-controlled oscillator signal. A differential amplifier is also included for producing a demodulated signal by amplifying the output of the phase comparator. The demodulated output of the differential amplifier is negatively fed back to the control terminal of the voltage-controlled oscillator.

In a third exemplary embodiment of the present invention, the voltage controlled oscillator oscillates in a state which keeps the differential amplifier at a balanced differential and the generation of an in-phase component from the oscillation signal is reduced. In addition, by using micro strip lines, most of the oscillation power of the voltage-controlled oscillator exists inside the dielectric of the printed circuit board preventing it from being radiated into the air. Thus, interference caused by radiating and leaking of the oscillation power to the input side of the demodulator is reduced.

BRIEF DESCRIPTION OF THE DRAWINGS

FIG. 2 is a graph of the frequency characteristic from an input terminal 1 to a monitor terminal 7 for a second IF signal in the phase locked loop type FM signal demodulator shown in FIG. 1(a) in accordance with the prior art.

FIG. 8 is a frequency characteristic from an input terminal 1 to a monitor terminal 7 of a second IF signal in the phase locked loop type FM signal demodulator, shown in FIG. 7(a), in accordance with the third exemplary embodiment of the present invention.

DETAILED DESCRIPTION OF THE INVENTION

First exemplary embodiment

Figure 1A:
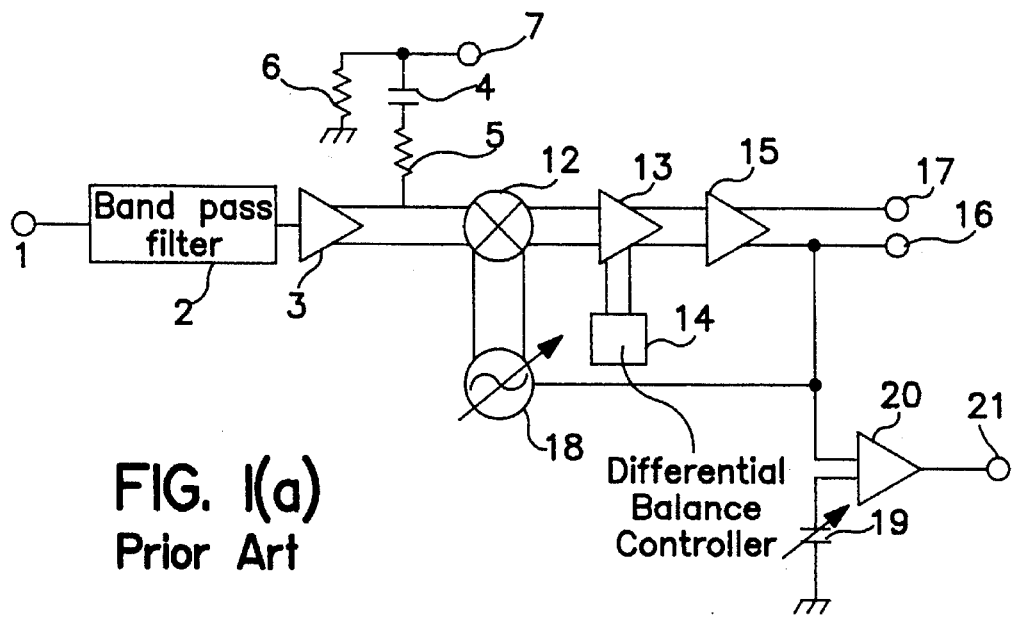
FIG. 1(a) is a circuit diagram, partly in block diagram form, of part of a phase locked loop type FM signal demodulator in accordance with the prior art.
Figure 3A:
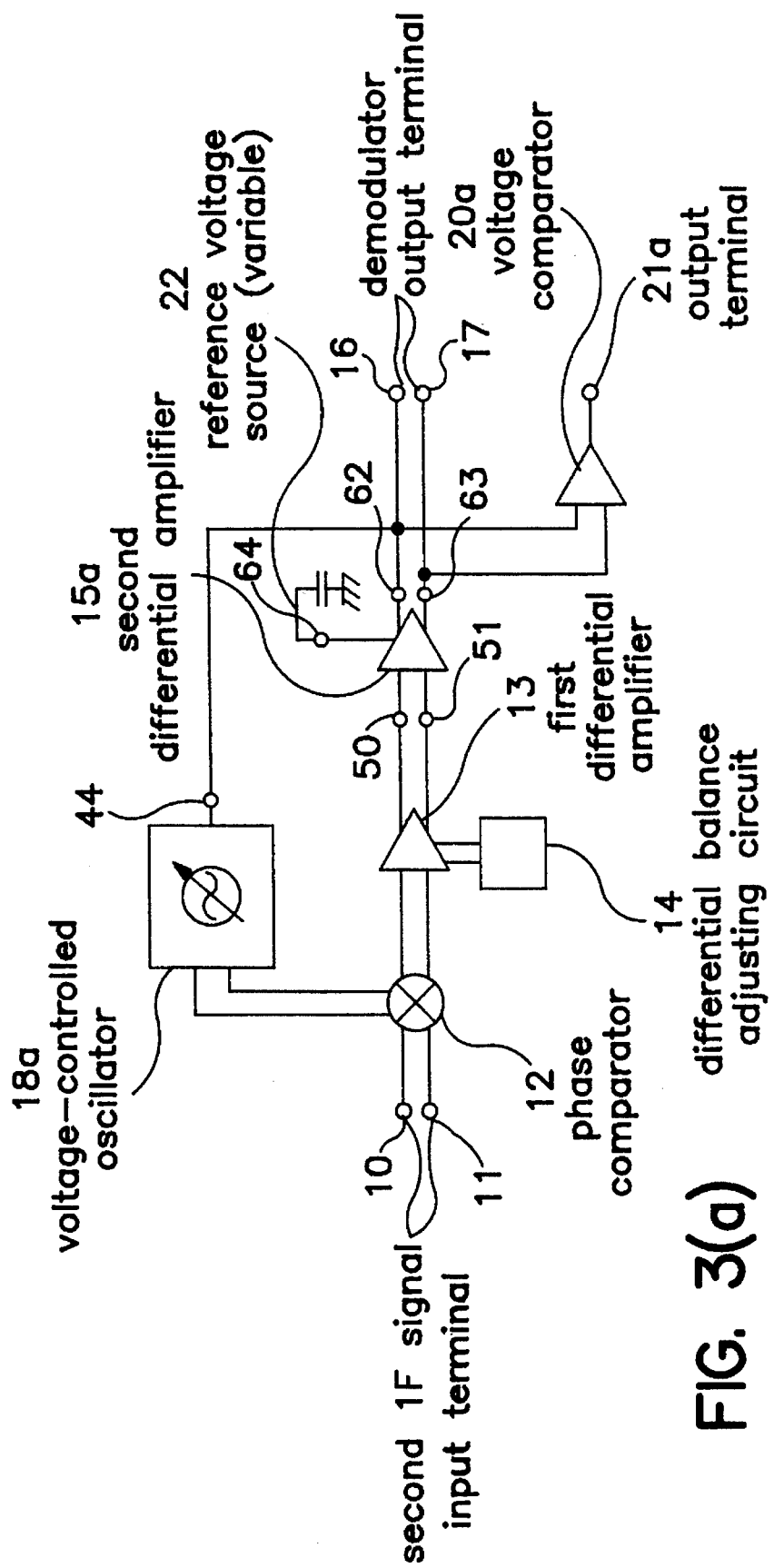
FIG. 3(a) is a block diagram of part of a phase locked loop type FM signal demodulator in accordance with a first exemplary embodiment of the present invention.

FIG. 3(a) is a block diagram of part of a phase locked loop type FM signal demodulator in accordance with a first exemplary embodiment of the present invention. The phase locked loop type FM signal demodulator includes a phase comparator 12, a first differential amplifier 13, a differential balance adjusting circuit 14 and a voltage-controlled oscillator 18 having similar functions to those in the prior art shown in FIG. 1(a). Accordingly, their detailed explanations are omitted.

A variable reference voltage is supplied from a reference voltage source 22 to a second differential amplifier 15a. Two input terminals of voltage comparator 20a are connected to balanced demodulator output terminals 16 and 17 of the second differential amplifier 15a to provide outputs proportional to the output difference between the demodulator output terminals 16 and 17 at terminal 21a. The demodulator output terminal 16 is connected to a control terminal 44 of a voltage-controlled oscillator 18a to form a negative feedback loop and, thus, a phase locked loop is formed.

Figure 1B:
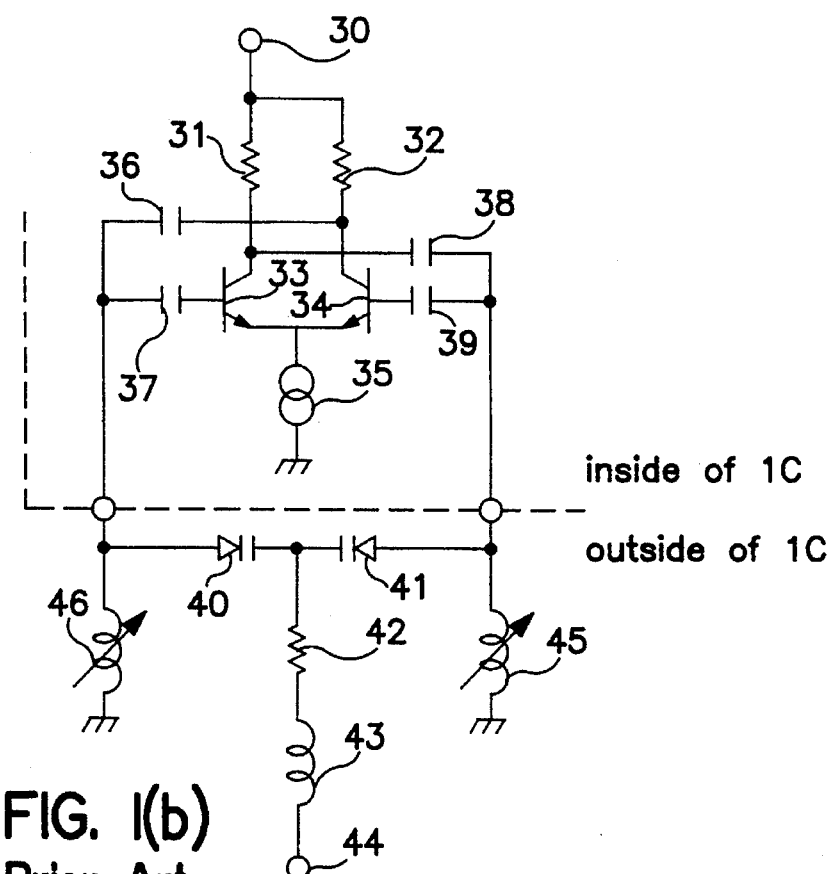
FIG. 1(b) is a circuit diagram of a voltage controlled oscillator 18, shown in FIG. 1(a), used in the phase locked loop type FM signal demodulator in accordance with the prior art.
Figure 3B:
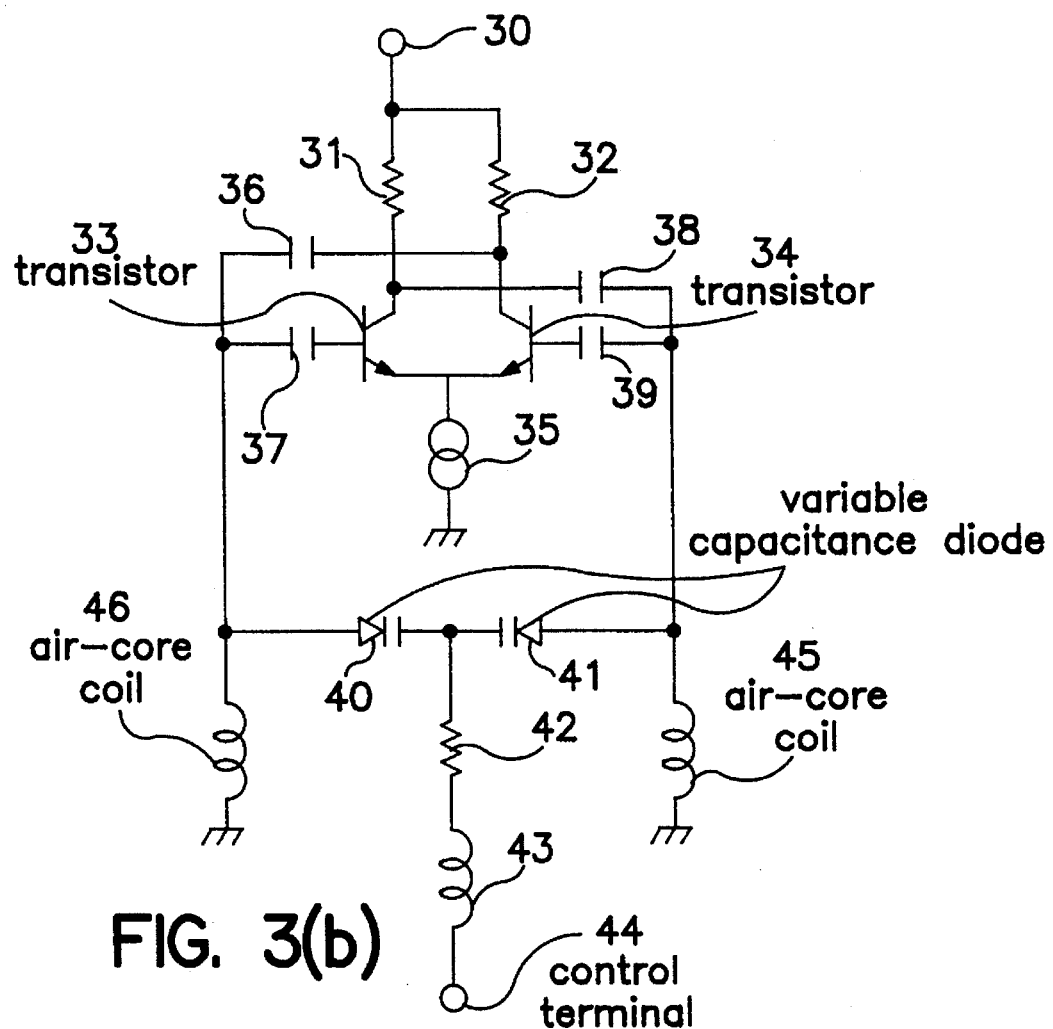
FIG. 3(b) is a circuit diagram of a voltage controlled oscillator 18a, shown in FIG. 3(a), used in the phase locked loop type FM signal demodulator in accordance with the first exemplary embodiment of the present invention.

FIG. 3(b) is a circuit diagram of the voltage-controlled oscillator 18a. The circuit elements having similar functions to those in FIG. 1(b) are numbered with the same reference numbers and, thus, their detailed explanations are omitted.

The voltage-controlled oscillator 18a oscillates at a resonance frequency determined by a resonant circuit composed of variable capacitance diodes 40 and 41 and air-core coils 45 and 46 similarly to that of the prior art. The voltage-controlled oscillator 18a is a frequency modulator controlled by a demodulated video signal output. It is desirable for video frequency bands under 10 MHz to make the output impedance of the second differential amplifier 15a seen from the control terminal 44 as low as possible so variations in the video signal are followed. The impedance at the junction point between the variable capacitance diodes 40 and 41 looking towards the control terminal 44 is desirably set high when oscillating at the second IF frequency of 400 MHz. Therefore a high impedance is provided by a series connection of resistor 42 and air-core coil 43.

Here, capacitors 36, 38 and 37, 39 are selected to have substantially the same capacitance which approximately is 3 pF. Resistor 42 is 39 ohms and the inductance of the air-core coil 43 is 120 nH.

Figure 4A:
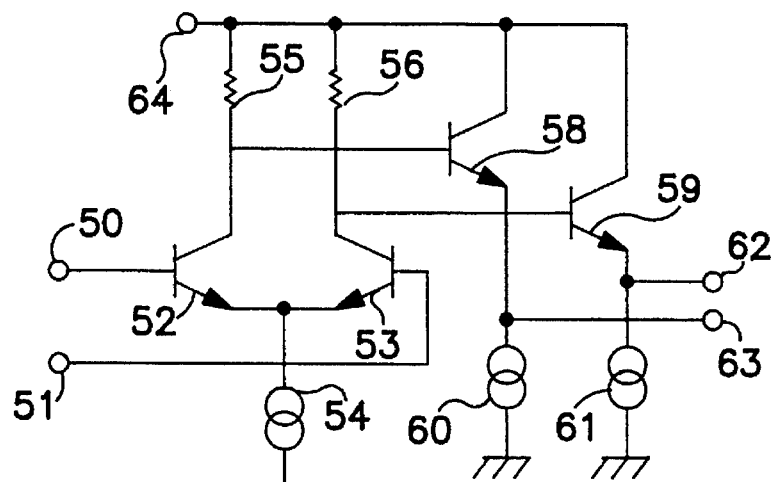
FIG. 4(a) is a circuit diagram of a second differential amplifier 15a, shown in FIG. 3(a), used in the phase locked loop type FM signal demodulator in accordance with the first exemplary embodiment of the present invention.

A circuit diagram of the second differential amplifier 15a is shown in FIG. 4(a).

The differential amplifier 15a is a DC amplifier for amplifying a phase difference signal including the video signal. The differential amplifier includes a differential amplifier including transistors 52 and 53 coupled to buffer amplifiers including transistors 58 and 59. The differential amplifier 15a amplifies the inputted phase difference signal and outputs the signal at a low impedance after adjusting the in-phase signal level using variable reference voltage source 22.

Figure 4B:
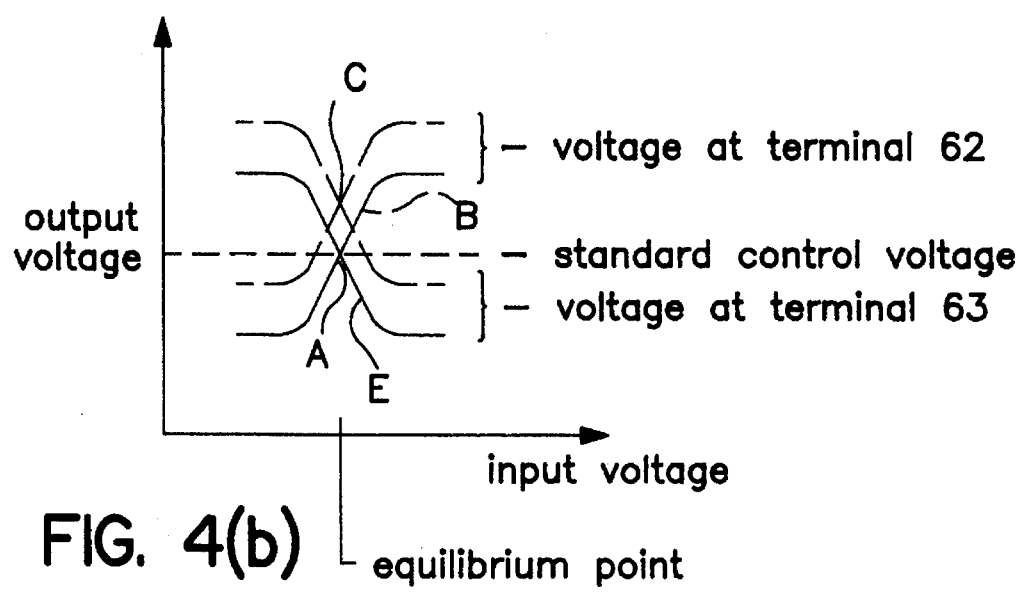
FIG. 4(b) is an input-output voltage characteristic of the second differential amplifier 15a, shown in FIG. 4(a), used in the phase locked loop type FM signal demodulator in accordance with the first exemplary embodiment of the present invention.

FIG. 4(b) is an input-output voltage characteristic of the second differential amplifier 15a. In FIG. 3(a), a wide band FM signal modulated by a video signal is supplied from input terminals 10 and 11 of the second IF signal to a phase comparator 12 as a second IF signal at 400 MHz. The phase comparator 12 detects a phase difference between the frequency modulated input signal and the output signal of the voltage controlled oscillator 18a and outputs a DC voltage signal corresponding to the phase difference. The DC voltage signal is outputted to the demodulator output terminals 16 and 17 through a low pass filter including a first differential amplifier 13 and the second differential amplifier 15a and at the same time it is negatively fed back to the voltage-controlled oscillator 18a. Thus, a phase locked loop is formed.

When the center frequency signal of the second IF is supplied to a phase locked loop as described above, the voltage-controlled oscillator 18a oscillates at the center frequency of the second IF signal because it is phase locked. However, because the variable capacitance diodes 40 and 41 usually have a capacitance dispersion of about ±15% for a constant cross terminal voltage, the characteristic of the oscillation frequency against the cross terminal voltage is not constant. That is, the output voltage of the second differential amplifier 15a varies and, as a result, the second differential amplifier 15a is not always in equilibrium. This is explained below using FIG. 4(b).

When the capacitance values of the variable capacitance diodes 40 and 41 are the standard value, the voltage-controlled oscillator 18a oscillates at a center frequency of the second IF at the standard control voltage and the working point of the apparatus is point A as shown in FIG. 4(b).

When the capacitance values of both variable capacitance diodes 40 and 41 are larger than the standard value (e.g. center value of design), it is necessary to supply a higher control voltage than the standard voltage to the control terminal 44 so the voltage-controlled oscillator 18a oscillates at the center frequency of the second IF. Therefore, the second differential amplifier 15a moves from equilibrium and the working point becomes point B shown in FIG. 4(b). At this time, a voltage is produced at output terminal 21a of the voltage comparator 20a corresponding to an output difference between terminals 62 and 63 which correspond to demodulator output terminals 16 and 17.

Accordingly, the working point becomes point C because the voltage of the reference voltage source 22 provides a supply voltage to the second differential amplifier 15a which is adjusted to be higher causing the output voltage at the equilibrium point of the input voltage to be adjusted higher. At this time, the second differential amplifier 15a is in equilibrium. During an adjustment, the voltages at terminals 62 and 63 are supplied to the voltage comparator 20a and the voltage of the reference voltage source 22 is adjusted so that the voltage difference between the working points B and E is minimized. The voltage comparison output from output terminal 21a of voltage comparator 20a can be used as a control voltage for an automatic frequency control (AFC) circuit. In addition, two voltage comparators which have an input voltage comparison characteristic which deviates a little bit from the equilibrium may be included for providing a dead zone (e.g. a permitted limit of frequency of the second IF signal from a specific value) when necessary for controlling the AFC circuit. In this case, a range of ±150 kHz from the second IF signal is usually selected as the dead zone.

The frequency or, the second IF signal which is inputted to the terminals 10,11 in FIG. 3(a) changes in steps since the phase locked loop circuit is included for generating the second IF signal. An automatic frequency control (AFC) circuit (not shown), which adjusts the frequency of the second IF signal, ends the adjustment and fixes the frequency when the frequency is entered in the permitted limit of ±150 kHz from the specific value since more adjustment makes the frequency jump to the next step out of the permitted limit.

In the FM signal demodulator, the voltage of the reference voltage source 22 in the second differential amplifier 15a is adjusted and the oscillation frequency of the voltage-controlled oscillator 18a is made to be the center frequency at the equilibrium condition of the second differential amplifier 15a.

The differential balance adjusting circuit 14 is adjusted so that when the FM signal is not supplied to the input terminals 10 and 11, the voltage-controlled oscillator 18a oscillates at the center frequency of the second IF signal. This is a free running frequency adjustment of the phase locked loop type FM signal demodulator.

Figure 5A:
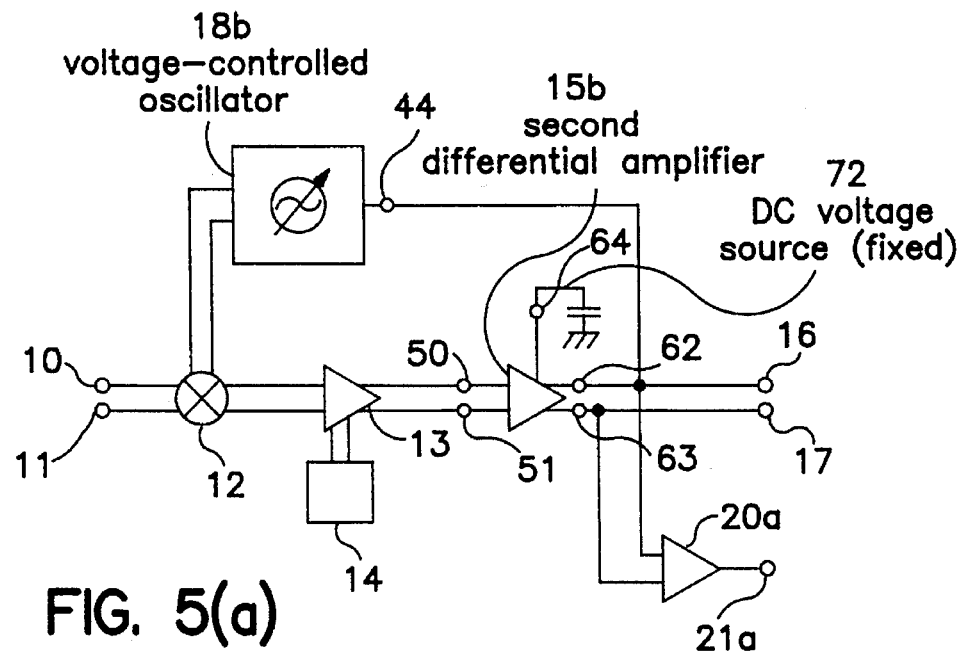
FIG. 5(a) is a block diagram of part of a phase locked loop type FM signal demodulator in accordance with a second exemplary embodiment of the present invention.

According to the first exemplary embodiment, the FM signal demodulator can be easily adjusted by adjusting the voltage of the reference voltage source 22 without adjusting the air-core coils 45 and 46 of the voltage-controlled oscillator 18. Further, the working point of the differential amplifier can be kept on the center of the dynamic range and the dynamic range can be wide even in a low voltage circuit.
Second exemplary embodiment FIG. 5(a) is a block diagram of part of a phase locked loop type FM signal demodulator in accordance with a second exemplary embodiment of the present invention. The blocks having similar functions to those in FIG. 3(a) of the first exemplary embodiment are numbered with the same reference numbers and, thus, their explanations are omitted.

A voltage source is supplied from a constant voltage source 72 to a second differential amplifier 15b which is different from the first exemplary embodiment. Two input terminals of a voltage comparator 20a are connected to demodulator output terminals 16 and 17 of the second differential amplifier 15b so that an output proportional to the difference between the outputs at the demodulator output terminals 16 and 17 is obtained at an output terminal 21a of voltage comparator 20a.

Figure 5B:
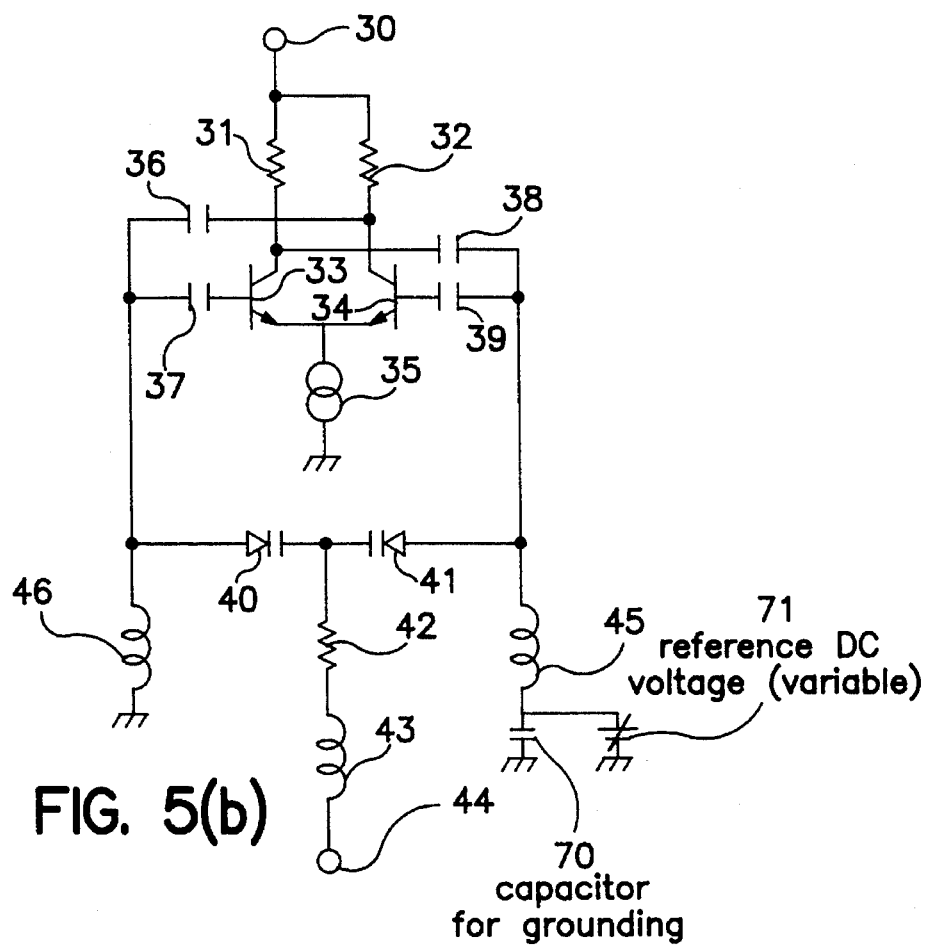
FIG. 5(b) is a circuit diagram of a voltage-controlled oscillator 18b, shown in FIG. 5(a), used in the phase locked loop type FM signal demodulator in accordance with the second exemplary embodiment of the present invention.

In voltage-controlled oscillator 18b shown in FIG. 5(b), the circuit elements having similar functions to those in FIG. 3(b) are numbered with the same reference numbers and, thus, their explanations are omitted. The ground side terminal of an air-core coil 45 is grounded by a parallel connection of capacitor 70 and a variable reference DC voltage. The capacitor 70 is provided to create a sufficiently low impedance at 400 MHz (second IF frequency of the satellite broadcast receiver). The oscillating frequency is adjusted by finely adjusting the cross terminal voltages of the variable capacitance diodes by the variable reference voltage 17.

The differential amplifier 15a is the same circuit as shown in FIG. 4(a) except that the differential amplifier 15a is connected to a fixed DC voltage source 72 instead of a variable DC voltage 22.

A constant voltage source 72 is supplied to second differential amplifier 15b. Two input terminals of a voltage comparator 20a are connected to demodulator output terminals 16 and 17 of second differential amplifier 15b so that an output which is proportional to the difference between the outputs at demodulator output terminals 16 and 17 is obtained at output terminal 21a of voltage comparator 20a.

Figure 6:
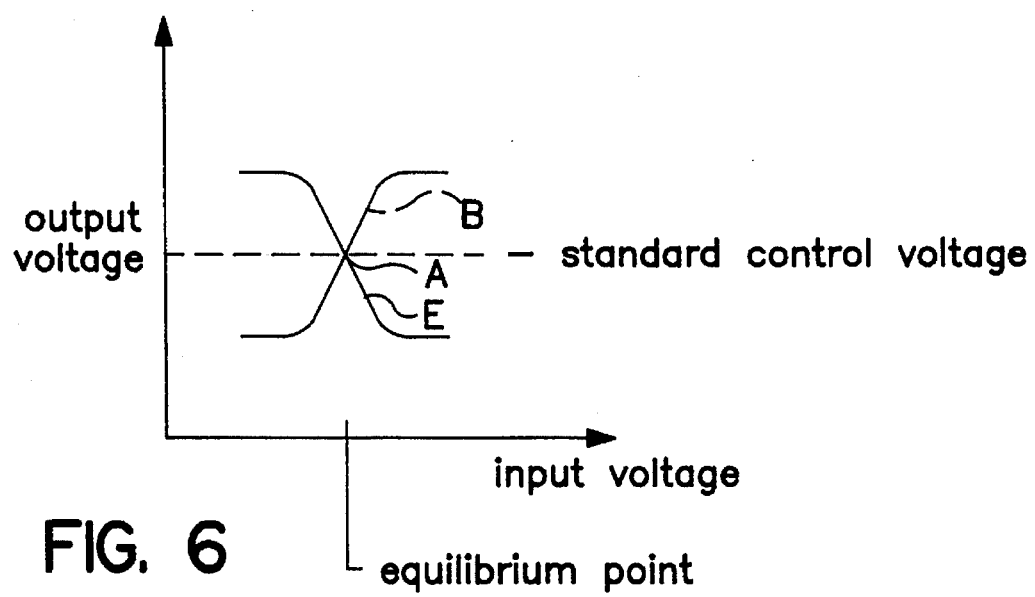
FIG. 6 is an input-output voltage characteristic of a second differential amplifier 15b, shown in FIG. 5(a), used in the phase locked loop type FM signal demodulator in accordance with the second exemplary embodiment of the present invention.

FIG. 6 shows an input-output voltage characteristic of the second differential amplifier 15a used in the phase locked loop type FM signal demodulator shown in FIG. 5(a) in accordance with the second exemplary embodiment of the present invention.

In FIG. 5(a), when the center frequency of the second IF signal is provided from terminals 10 and 11 to the phase locked type FM signal demodulator, the voltage-controlled oscillator 18b is phase-locked and oscillates at the center frequency of the second IF signal. However, because the variable capacitance diodes 40 and 41 usually have a capacitance dispersion of ±15% at a constant cross terminal voltage, as described above, the oscillating frequency characteristic against the cross terminal voltage is not constant.

That is, the output voltage of the differential amplifier 15a varies and, as a result, equilibrium is not always maintained.

As shown in FIG. 6, the voltage-controlled oscillator 18b oscillates at a center frequency of the second IF signal at the standard control voltage, when the variable capacitance diodes 40 and 41 have a standard capacitance value. Accordingly, the working point becomes point A.

However, when both of the variable capacitance diodes 40 and 41 have capacitance values larger than the standard value, it is necessary to supply a higher voltage than the standard value to the control terminal 44 so voltage-controlled oscillator 18b oscillates at the center frequency of the second IF signal. Accordingly, the second differential amplifier 15a moves from equilibrium and the working point becomes point B. At this time, a voltage corresponding to the output difference between terminals 62 and 63 corresponding to demodulator output terminals 16 and 17, is provided at the output terminal 21a of the voltage comparator 20a.

If the reference voltage 71 of the voltage-controlled oscillator 18b is decreased lower than the standard value, that is if the cathode potential of the variable capacitance diode 41 is adjusted to be relatively higher, the working point returns to point A and the second differential amplifier 15b moves to equilibrium. In an adjustment, the voltages of terminals 62 and 63 are provided to the voltage comparator 20a and the voltage of the reference voltage source 71 is adjusted so that the voltage difference between working points B and E is minimized. The voltage comparison provided by output terminal 21a of voltage comparator 20a is obtained at this time and can be used as a control voltage for an automatic frequency control circuit. In the second exemplary embodiment, it is possible to provide a dead zone as in the first exemplary embodiment. The differential balance adjusting circuit 14 is also adjusted as in the first exemplary embodiment.

Thus, in the second exemplary embodiment, the FM signal demodulator can be easily adjusted by adjusting the voltage of the reference voltage source 71 without adjusting air-core coils 45 and 46 of voltage-controlled oscillator 18.

Further, the working point of the differential amplifier can be maintained at the center of the dynamic range and the dynamic range can be widened in a low voltage circuit.

Third exemplary embodiment

Figure 7A:
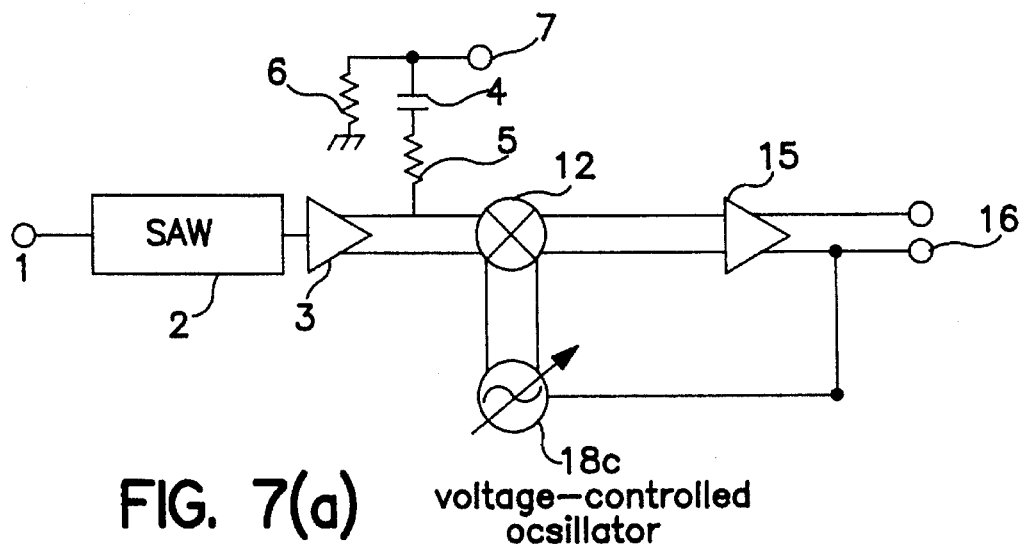
FIG. 7(a) is a block diagram of part of a phase locked loop type FM signal demodulator in accordance with a third exemplary embodiment of the present invention.

FIG. 7(a) is a block diagram of an essential part of a phase locked loop type FM signal demodulator in accordance with a third exemplary embodiment of the present invention. The blocks having similar functions to those in FIG. 3(a) and FIG. 5(a) of the first and second exemplary embodiments, respectively, are numbered with the same reference numbers and the blocks having similar functions to those in FIG. 1(a) of the prior art such as second IF signal input terminal 1, SAW bandpass filter 2 and second IF amplifier 3 are numbered with the same reference numbers and, thus, their explanations are omitted.

Figure 7B:
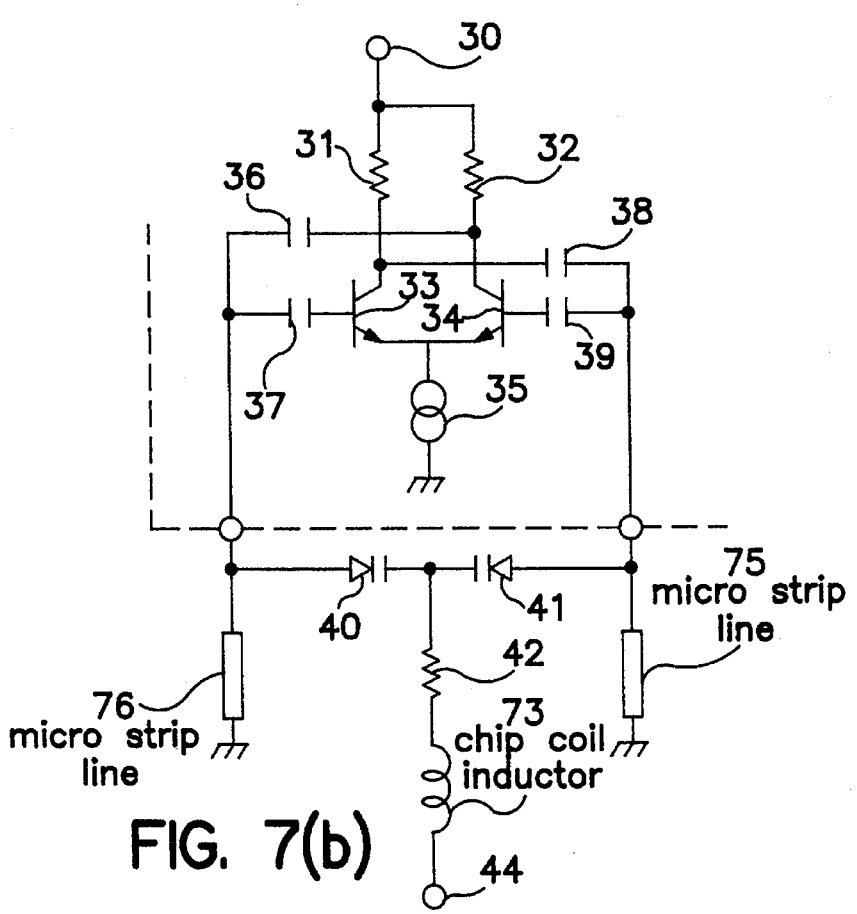
FIG. 7(b) is a circuit diagram of a voltage controlled oscillator 18c, shown in FIG. 7(a), used in the phase locked loop type FM signal demodulator in accordance with the third exemplary embodiment of the present invention.

FIG. 7(b) is a circuit diagram of a voltage-controlled oscillator 18c. In FIG. 7(b), the circuit elements having similar functions to those in FIG. 3(a) are numbered with the same reference numbers and, thus, their explanations are omitted. The third exemplary embodiment includes micro strip lines 75 and 76 in place of air-core coils 45 and 46 and chip coil inductor 73 in place of air-core coil 43. Microstrip Lines and Slotlines, Artech House, inc., by K. C. Grupts, Ramesh Garq and I. J. Bahi, incorporated herein by reference, discusses microstrip lines.

A resonant circuit composed of the variable capacitance diodes 40 and 41 and the micro strip lines 75 and 76 oscillates at its intrinsic resonant frequency. The voltage controlled oscillator 18c oscillates maintaining differential balance if the capacitances of the variable capacitance diodes 40 and 41 and length of the micro strip lines 75 and 76 are substantially the same. The voltages at the cathodes of the variable capacitance diodes 40 and 41 have reverse phases and nearly equal amplitudes because the oscillation circuit is symmetric.

Further, because the junction point between the variable capacitance diodes 40 and 41 forms an imaginary ground point for the differential amplifier 18c including transistors 33 and 34, the stability of the oscillation state is barely affected when a video signal is applied at this point from the outside and the differential amplifier 18c is modulated.

As in the first and the second exemplary embodiments, it is desirable that the output impedance of the differential amplifier 15 seen from the control terminal 44 is as low as possible at video frequency bands lower than 10 MHz. It is also desirable that the impedance of the control terminal 44 seen from the junction point of the variable capacitance diodes 40 and 41 is high enough at the second IF signal of 400 MHz.

In the third exemplary embodiment, a chip coil inductor 73 is used instead of an air-core coil 43. The inductance of the chip coil inductor is approximately 120 nH. A chip coil inductor can replace air-core coil 43 in the first and the second exemplary embodiments and an air-core coil can be used instead of a chip coil inductor in the third exemplary embodiment and vice versa.

In a printed micro strip line, electromagnetic field concentrates between the ground pattern on the back side of the printed circuit board and the micro strip line on the face side of the printed circuit board. Therefore, most of the oscillation power of the voltage-controlled oscillator 18c exists inside the dielectric of the printed circuit board and beneath the micro strip lines. As a result, radiation in the air is reduced and is less then the radiation from the air-core coils. In addition, if spiral lines are used instead of strip lines, the concentration of the electromagnetic field increases.

FIG. 8 illustrates the frequency characteristic measured from input terminal 1 to monitor terminal 7 of a second IF signal in a phase locked loop type FM signal demodulator in accordance with the third exemplary embodiment of the present invention. The characteristic A was measured when the voltage-controlled oscillator 18c does not oscillate and characteristic B was measured when the voltage-controlled oscillator 18c normally oscillates and the phase locked loop is locked.

Although some interference was detected (1) causing the signal of the voltage-controlled oscillator 18c to radiates, (2) causing leaks into the input stage of the FM signal demodulator, (3) disturbing the wave form of the SAW bandpass filter a small amount, the amount of interference is improved as compared to the interference generated by the prior art.

The video signal demodulated using the FM signal demodulator in accordance with the exemplary embodiment of the present invention was measured to have good characteristics with a differential gain of less than 1% and a differential phase of less than one degree when using satellite broadcast transmission standards. The modulation sensitivity which is the variation of the oscillating frequency against the control voltage of voltage-controlled oscillator 18c was measured to be approximately 20 MHz/V and the signal to noise ratio of the video signal was measured to be less than 65 dB.

In the three exemplary embodiments described above, two variable capacitance diodes are used improving the differential function of the voltage-controlled oscillator. One of the two variable capacitance diodes can be replaced with a chip capacitor having approximately the same capacitance. The exemplary embodiments of the present invention can accommodate an oscillating frequency of 400 MHz and a working frequency band width of 27 MHz for one channel while maintaining linearity between the oscillating frequency and the control voltage at the working frequency band. The higher the modulation sensitivity, the smaller the amplitude of the control voltage. As a result, good linearity of the differential amplifier and the voltage controlled oscillator can be obtained since a smaller output is possible.

Good linearity of the control voltage can be maintained if the dynamic range of the differential amplifier is narrow. If the modulation sensitivity is larger than 40 MHz, the signal to noise ratio of the demodulator can become worse. Therefore, in this case, it can be preferable to use one variable capacitance diode.

Good linearity between the oscillating frequency and the control voltage can be obtained by carefully selecting the capacitance-voltage characteristic of the variable capacitance diode. For example, sometimes usage of fixed capacitor having an adequate capacitance value instead of or with the variable capacitance diode to correct the capacitance-voltage characteristic of the variable capacitance diode is effective for obtaining good linearity between the oscillating frequency and the control voltage if the capacitance-voltage characteristic of the variable capacitance diode degrades the linearity. Of course, the inductance of the coil is selected to an adequate value corresponding to the capacitance value.

Thus, according to the exemplary embodiments, an FM signal demodulator can be realized which (1) prevents interference due to radiating and leaking of the oscillation power of the voltage-controlled oscillator to the input stage of the FM signal demodulator and (2) has a stable demodulation characteristic.

Voltage-controlled oscillator 18a used in the first exemplary embodiment can be replaced by voltage-controlled oscillator 18b used in the second exemplary embodiment and voltage-controlled oscillator 18b used in the second exemplary embodiment can be replaced with voltage-controlled oscillator 18a used in the first exemplary embodiment. The chip capacitor having fixed capacitance can be replaced with either variable capacitance diode 40 or 41.

It is obvious that any combination of a demodulator circuit and a voltage-controlled oscillator can be used.

The above-mentioned exemplary embodiments are not restricted to use for satellite broadcast reception and are generally applicable to demodulators for an FM signal.

The invention may be embodied in other specific form without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed:

1. A frequency modulation signal demodulator receiving an intermediate frequency signal having a first phase, said frequency modulation signal demodulator comprising:

voltage-controlled oscillator means including a resonant circuit having variable capacitance diodes, for varying an oscillating frequency of a signal having a second phase by controlling a respective voltage across each of the variable capacitance diodes using an oscillator direct current voltage signal;

phase comparator means for producing a phase difference by comparing said first phase and said second phase and providing a comparator direct current voltage signal corresponding to the phase difference; and differential amplifier means having an adjustable reference voltage source as a power source, for amplifying the comparator direct current voltage signal to produce demodulated differential output signals, one of said demodulated differential output signals is negatively fed back to said voltage-controlled oscillator as said oscillator direct current voltage signal voltage comparator means for comparing said demodulated differential output signals to produce a difference component which represents a difference voltage between the demodulated differential output signals, wherein, said adjustable reference voltage source is adjusted to a value so that said difference component is made smaller than a specific value when a center frequency of said intermediate frequency signal having the first phase is input to the frequency modulation signal demodulator.

2. A frequency modulation signal demodulator as recited in claim 1, said voltage-controlled oscillator means comprising:

(a) a resonant circuit having a pair of variable capacitance diodes and a pair of micro strip lines having substantially the same length; and (b) a differential amplifier positively fed back through capacitors.

3. The frequency modulation signal demodulator as recited in claim 2, wherein one capacitor of said pair of variable capacitance diodes is a fixed capacitor.

4. The frequency modulation signal demodulator as recited in claim 2, further comprising a first differential amplifier means, coupled to the differential amplifier means, for providing differential balance adjusting which makes the voltage-controlled oscillator means oscillate at a center frequency of the intermediate frequency signal when the intermediate frequency signal is not provided to said phase comparator means.

5. The frequency modulation signal demodulator as recited in claim 2 further including a voltage comparator having two input terminals and wherein the demodulated signal is supplied to said two input terminals of said voltage comparator.

6. The frequency modulation signal demodulator as recited in claim 1, wherein said resonant circuit has a pair of variable capacitance diodes and a pair of air-core coils and wherein said voltage-controlled oscillator further includes (a) capacitors; and (b) a differential amplifier which is positively fed back through said capacitors.

7. The frequency modulation signal demodulator as recited in claim 6, wherein one capacitor of said pair of variable capacitance diodes is a fixed capacitor.

8. The frequency modulation signal demodulator as recited in claim 1, wherein said resonant circuit has a pair of variable capacitance diodes and a pair of micro strip lines having substantially the same length and wherein said voltage-controlled oscillator further includes (a) capacitors; and (b) a differential amplifier which is positively fed back through said capacitors.

9. The frequency modulation signal demodulator as recited in claim 8, wherein one capacitor of said pair of variable capacitance diodes is a fixed capacitor.

10. The frequency modulation signal demodulator as recited in claim 1, further comprising a first differential amplifier means, coupled to said differential amplifier means, for providing differential balance adjusting which makes the voltage-controlled oscillator means oscillate at a center of the intermediate frequency signal when the intermediate frequency signal is not provided to said phase comparator means.

11. The frequency modulation signal demodulator as recited in claim 1 further including a voltage comparator having two input terminals and wherein the demodulated signal is supplied to said two input terminals of said voltage comparator.

12. A frequency modulation signal demodulator receiving an intermediate frequency signal having a first phase, said frequency modulation signal demodulator comprising:

voltage-controlled oscillator means including a resonant circuit having variable capacitance diodes, for varying an oscillating frequency of a signal having a second phase by controlling a voltage across the variable capacitance diodes using an oscillator direct current voltage signal and a fine adjustment reference voltage;

phase comparator means for producing a phase difference by comparing the first phase and the second phase and providing a comparator direct current voltage signal corresponding to said phase difference; and differential amplifier means for amplifying said comparator direct current voltage signal to produce demodulated differential output signals, one of said demodulated differential output signals is negatively fed back to said voltage-controlled oscillator as said oscillator direct current signal voltage comparator means for comparing said demodulated differential output signals to produce a difference component which represents a difference voltage between the demodulated differential output signals, wherein, said fine adjustment reference voltage is adjusted to a value so that said difference component is made smaller than a specific value when a center frequency of said intermediate frequency signal having the first phase is input to the frequency modulation signal demodulator.

13. The frequency modulation signal demodulator as recited in claim 12 wherein said resonant circuit has said pair of variable capacitance diodes and a pair of air-core coils and wherein said voltage-controlled oscillator further comprises (a) capacitors; and (b) a differential amplifier which is positively fed back through said capacitors.

14. The frequency modulation signal demodulator as recited in claim 13, wherein one capacitor of said pair of variable capacitance diodes is a fixed capacitor.

15. The frequency modulation signal demodulator as recited in claim 12 wherein said resonant circuit has a pair of variable capacitance diodes and a pair of micro strip lines having substantial the same length and said voltage-controlled oscillator further comprises:

(a) capacitors; and (b) a differential amplifier which is positively fed back through said capacitors.

16. The frequency modulation signal demodulator as recited in claim 15, wherein one capacitor of said pair of variable capacitance diodes is a fixed capacitor.

17. The frequency modulation signal demodulator as recited in claim 12, further comprising a first differential amplifier means, coupled to the differential amplifier means, for providing differential balance adjusting which makes the voltage-controlled oscillator means oscillate at a center frequency of the intermediate frequency signal when the intermediate frequency signal is not provided to said phase comparator means.

18. The frequency modulation signal demodulator as recited in claim 12 further including a voltage comparator having two input terminals and wherein the demodulated signal is supplied to said two input terminals of said voltage comparator.

19. The frequency modulation signal demodulator as recited in claim 12, said voltage-controlled oscillator means comprising:

(a) a resonant circuit having a pair of variable capacitance diodes and a pair of micro strip lines having substantially the same length; and (b) a differential amplifier positively fed back through capacitors.

20. The frequency modulation signal demodulator as recited in claim 19, further comprising a first differential amplifier means, coupled to said differential amplifier means, for providing differential balance adjusting which makes the voltage-controlled oscillator means oscillate at a center frequency of the intermediate frequency signal when the intermediate frequency signal is not provided to said phase comparator means.

21. The frequency modulation signal demodulator as recited in claim 19, said voltage comparator means comprising two input terminals for receiving said demodulated differential output signals.

22. The frequency modulation signal demodulator as recited in claim 19, wherein one of the pair of the variable capacitance diodes is a fixed capacitor.

* * * * *